United States Patent
Seyrat et al.

(10) Patent No.: US 6,825,781 B2
(45) Date of Patent: Nov. 30, 2004

(54) METHOD AND SYSTEM FOR COMPRESSING STRUCTURED DESCRIPTIONS OF DOCUMENTS

(75) Inventors: Claude Seyrat, Paris (FR); Cedric Thienot, Paris (FR)

(73) Assignee: Expway, Reims (FR)

( * ) Notice: Subject to any disclaimer, the term of this patent is extended or adjusted under 35 U.S.C. 154(b) by 0 days.

(21) Appl. No.: 10/470,218
(22) PCT Filed: Feb. 4, 2002
(86) PCT No.: PCT/EP02/01333
§ 371 (c)(1),
(2), (4) Date: Nov. 10, 2003
(87) PCT Pub. No.: WO02/063775
PCT Pub. Date: Aug. 15, 2002

(65) Prior Publication Data
US 2004/0068696 A1 Apr. 8, 2004

Related U.S. Application Data
(60) Provisional application No. 60/265,901, filed on Feb. 5, 2001.

(51) Int. Cl.$^7$ .............................. H03M 7/00; G06F 7/00
(52) U.S. Cl. ......................................... 341/50; 707/100
(58) Field of Search ..................... 341/50, 51; 707/100, 707/101; 715/513; 713/200, 201

(56) References Cited

U.S. PATENT DOCUMENTS

| | | | | |
|---|---|---|---|---|
| 6,052,686 A | * | 4/2000 | Fernandez et al. | 707/100 |
| 2003/0217289 A1 | * | 11/2003 | Ammon et al. | 713/201 |
| 2004/0107402 A1 | * | 6/2004 | Seyrat et al. | 715/513 |
| 2004/0139393 A1 | * | 7/2004 | Heuer et al. | 715/513 |

* cited by examiner

*Primary Examiner*—Peguy JeanPierre
(74) *Attorney, Agent, or Firm*—Bachman & LaPointe, P.C.

(57) ABSTRACT

An encoding method for enabling a decoder to decode a structured document having a structure defined in a first schema not accessible to the decoder and resulting from a change of a second schema accessible to the decoder, the first schema defining at least one information element which is derived from a corresponding element defined in the second schema, the encoding method comprising the steps of: encoding the document using said first and second schemas into a binary stream comprising for each elements of the document a binary sequence encoding the element, and inserting in the binary sequence encoding the derived element a reference designating the first schema in which the structure of the derived element is defined, said reference designating the first schema being defined in a schema reference list containing references to all schemas used for encoding the document, the schema reference list being made accessible to the decoder.

17 Claims, 2 Drawing Sheets

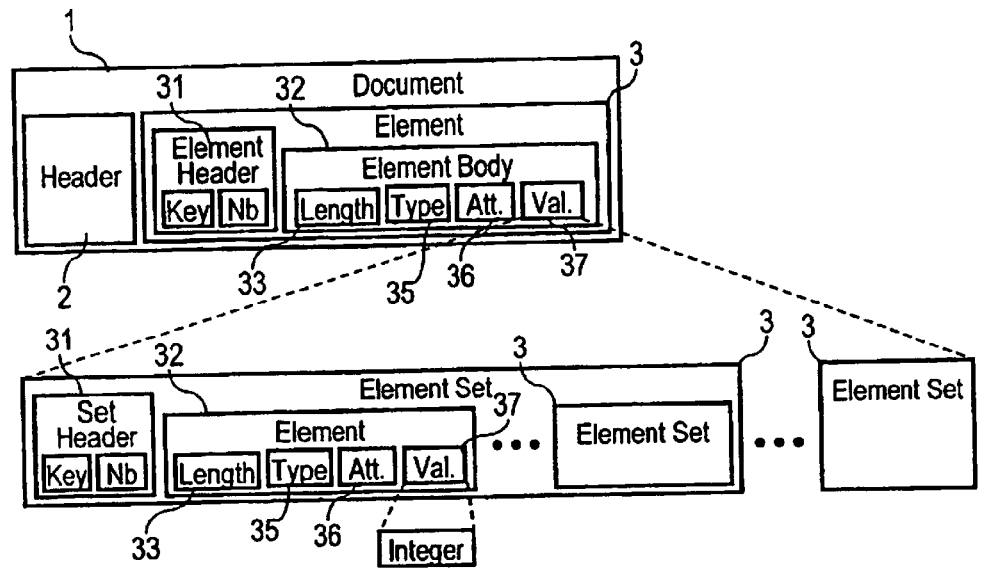
Fig. 1
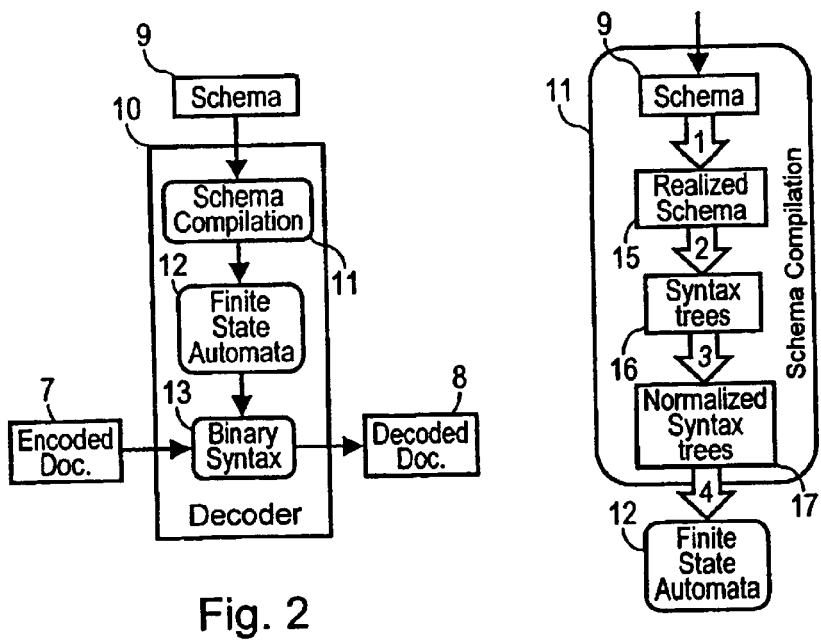
Fig. 2
Fig. 2a

METHOD AND SYSTEM FOR COMPRESSING STRUCTURED DESCRIPTIONS OF DOCUMENTS

This application claims the benefit of Provisional Application No. 60/265,901, filed Feb. 5, 2001.

BACKGROUND OF THE INVENTION

1. Field of the Invention

The invention relates in general to the field of computer systems, and more particularly to a method and system for the compression of structured documents using document descriptions that conforms to a generalized markup language, such as SGML (Standard Generalized Markup Language) and XML (Extensible Markup Language). Such documents may contain multimedia information.

2. Description of the Related Art

In a few years, computer networks became the main media for communications. Computers can now be plugged to a shared network, operating systems allow applications to easily exchange messages, Internet infrastructure allows computers to find their interlocutor, applications use complex algorithms to synchronize themselves.

In such a context of interoperability, generalized markup languages provides solutions to deal with document processing. Indeed, the structure of a document plays a main role in the document usage. Formatting, printing or indexing a document is essentially made in accordance with its structure. SGML was initially made to easily dissociate document presentation and document structure and content. Because of its ability to encode structures, XML attracted attention from different communities interested in non-document applications. XML audience widened to include (among others) electronic commerce, databases and knowledge representation communities.

XML and more generally markup languages are now widely used to describe and structure documents (metadata). A structured document comprises several information elements which may be nested in each other. The information elements are identified and separated from each other by tags, which identify the element types of the information elements. A structured document generally comprises a first information element or base element which represents the entire document and which is identified by tags marking the start and end of the document. This first element comprises information sub-elements, for instance paragraphs of text, each information sub-element being identified by tags marking the start and end of the element. Tags may be associated with tag attributes that specifies one or more characteristics of the information element.

Tag content represents information that is generally intended to be displayed or manipulated by a user. Tag content may be optional or required according to the type of tag, and may contain other nested information sub-elements which in turn are delimited by tags and have content and attributes.

A structured document may be associated with a schema which reflects the rules that the structured document should verify in order to be considered as "valid". It also contains information about default values, element and attributes types and type hierarchies. Validity ensures that a received document is conformant to the schema and thus has the intended meaning. Moreover it determines what is the nature, i.e. the type of each description item (information element or attributes). XML standard includes an XML Schema Language which is designed to specify a grammar for a class of XML documents having similar structures.

However XML is a verbose language and thus it is inefficient to be processed and costly to be transmitted. For this reason, ISO/IEC 15938-1 and more particularly MPEG-7 (Moving Picture Expert Group) proposes a method and a binary format for encoding (compressing) the description of a structured document and decoding such a binary format. This standard is more particularly designed to deal with highly structured data, such as multimedia data.

In order to gain compression efficiency, this method relies upon a schema analysis phase. During this phase, internal tables are computed to associate a binary code to each XML elements, types and attributes. This method mandates the full knowledge of the same schema by an encoder and a corresponding decoder.

When a schema used to encode structured documents requires to be extended, the best solution is to make the extended schema available to the decoder. However in specific cases, it is not possible to easily update the decoders in order to give them access to the extended schema.

SUMMARY OF THE INVENTION

An object of the invention is to provide a method for encoding a structured document in such a manner that the document can be partially decoded even if every needed schema are not known by the decoder.

Another object of the invention is to provide such an encoding method ensuring a backward and forward compatibility, i.e. enabling a decoder to at least partially decode a structured document having a structure defined in at least a first schema not accessible to the decoder and resulting from a change of at least a second schema accessible to the decoder, a structured document comprising information elements nested in each other, the information elements of the document being associated in at least a first and a second schemas with respective element types each defining the respective element structures of the information elements, the first schema being not accessible to a decoder and the second schema being accessible to the decoder, the first schema defining at least one derived information element which is derived from a corresponding element defined in the second schema.

According to the present invention, the encoding method comprises the steps of:

encoding the document using said first and second schemas into a binary stream comprising for each information elements of the document a binary sequence encoding the information element, and inserting in the binary sequence encoding the derived information element a reference designating the first schema in which the structure of the derived element is defined, said reference designating the first schema being defined in a schema reference list containing references to all schemas used for encoding the document, the schema reference list being made accessible to the decoder.

According to an aspect of the present invention, the binary sequence encoding each element of the document comprises a content field containing an encoded value of the element and a length field placed before the content field and containing an encoded value of a length of the content field.

According to another aspect of the present invention, the derived information element is associated in the first schema to a structure type which is restricted with respect to the structure type of the corresponding information element in the second schema, the binary sequence encoding the derived element comprising a content field and appended to the content field, a reference to the first schema and a reference to the structure type of the derived element, defined in the second schema.

According to another aspect of the present invention, the derived information element is associated in the first schema to a structure type which is extended with respect to the structure type of the corresponding information element in the second schema, the structure type of the derived information element comprising a first part having the structure type of the corresponding information element defined in the second schema and a second part specific to the derived information element and having a structure type defined in the first schema, the binary sequence encoding the derived element comprising a content field comprising:

a field containing the reference to the second schema, a field containing a structure type reference to the structure type of the corresponding element in the second schema, a field containing an encoded value of the first part, a field containing the reference to the first schema, a field containing a structure type reference to the structure type of the second part, and a field containing an encoded value of said second part.

According to another aspect of the present invention, the binary sequence encoding an information element comprises a substitution field including a substitution flag indicating whether or not the name of the information element is changed, and if the substitution flag indicates a change, an element name reference field containing a reference designating a new name of the information element, and a schema reference field containing a reference to a schema where the new name reference is defined.

According to another aspect of the present invention, the binary sequence encoding at least one information element in the encoded document comprises a schema status mode field having:

a first state indicating that the information element is not changed in the first schema with respect to a corresponding element in the second schema, a second state indicating that none of sub-elements of the information element are changed in the first schema with respect to the corresponding element in the second schema, and a third state indicating that the information element is changed in the first schema with respect to the corresponding element in the second schema, the encoded information element comprising any schema reference and any other change information when the schema status mode field is in the first state, and none of sub-elements of the information element comprising a schema reference and any other change information when the schema status mode field is in the second state.

According to another aspect of the present invention, the binary sequence encoding at least one information element in the encoded document comprises a schema status mode field having a first state indicating that the information element is not changed in the first schema with respect to a corresponding element in the second schema, a second state indicating that none of sub-elements of the information element are changed in the first schema with respect to the corresponding element in the second schema, a third state indicating that the information element is changed in the first schema with respect to the corresponding element in the second schema, and a fourth state indicating that the information element is changed in the first schema with respect to the corresponding element in the second schema and that none of sub-elements of the information element are changed in the first schema with respect to the corresponding element in the second schema, the encoded information element comprising any schema reference and any other change information when the schema status mode field is in the first state, and none of sub-elements of the information element comprising a schema reference and any other change information when the schema status mode field is in the second state or fourth state.

According to another aspect of the present invention, the schema reference list comprising references to all schemas used for encoding the structured document is inserted in a header associated to the binary stream encoding the structured document.

Another object of the present invention is to provide a method for at least partially decode a binary stream encoding a structured document having a structure defined in at least a first schema not accessible to the decoder and resulting from a change of at least a second schema accessible to the decoder, a structured document comprising information elements nested in each other, the information elements of the document being associated in at least a first and a second schemas with respective element types each defining the respective element structures of the information elements, the first schema being not accessible to a decoder and the second schema being accessible to the decoder, the first schema defining at least one derived information element which is derived from a corresponding element defined in the second schema.

According to the present invention, the decoding method comprises the steps of:

sequentially reading a binary stream encoding the structured document using the second schema so as to detect in the binary stream binary sequences encoding each information element of the document, detecting in a each detected binary sequence of an encoded information element a reference to the first schema, as defined in a schema reference list known by the decoder, if such a reference to the first schema is not detected in the detected binary sequence, decoding said detected binary sequence according to the corresponding element in the second schema, a field containing an encoded value of the first part, a field containing the reference to the first schema, a field containing a structure type reference to the structure type of the second part, and skipping said binary data relative to said first schema during the sequential reading and decoding of said binary stream.

According to another aspect of the present invention, the binary sequence encoding each element of the document comprises a content field containing an encoded value of the element and a length field placed before the content field and containing the length encoded value, the length encoded value being used by the decoder for determining the end of the binary sequence encoding an element.

According to another aspect of the present invention, the decoding method further comprises the steps of:

reading and decoding a length coded value in the binary sequence containing a reference to the first schema, and determining a length of binary data to skip as a function of the decoded length value and the position in the binary sequence of the reference to the first schema.

According to another aspect of the present invention, the derived information element is associated in the first schema to a structure type which is restricted with respect to the structure type of the corresponding information element in the second schema, the binary sequence encoding the derived element comprising a content field and appended to the content field, a reference to the first schema and a reference to the structure type of the derived element, defined in the second schema According to another aspect of the present invention, the derived information element is associated in the first schema to a structure type which is extended with respect to the structure type of the corresponding information element in the second schema, the structure type of the derived information element comprising a first part having the structure type of the corresponding information element defined in the second schema and a second part specific to the derived information element and having a structure type defined in the first schema, the binary sequence encoding the derived element comprising a content field comprising:

a field containing the reference to the second schema, a field containing a structure type reference to the structure type of the corresponding element in the second schema, a field containing an encoded value of the first part, a field containing the reference to the first schema, a field containing a structure type reference to the structure type of the second part, and a field containing an encoded value of said second part.

According to another aspect of the present invention, the derived information element has in the first schema a name which is changed with respect to the name of the corresponding information element in the second schema, the binary sequence encoding the derived element including a substitution field comprising a substitution flag indicated whether or not the name of the derived information element is changed, and if the substitution flag indicates a change, a schema reference field containing a reference to the first schema and an element name reference designating the name of the derived information element in the first schema.

According to another aspect of the present invention, the binary sequence encoding at least one information element in the encoded document comprises a schema status mode field having:

a first state indicating that the information element is not changed in the first schema with respect to a corresponding element in the second schema, a second state indicating that none of sub-elements of the information element are changed in the first schema with respect to the corresponding element in the second schema, and a third state indicating that the information element is changed in the first schema with respect to the corresponding element in the second schema, the encoded information element comprising no schema reference and no other change information when the schema status mode field is in the first state, and none of sub-elements of the information element comprising a schema reference and any other change information when the schema status mode field is in the second state.

According to another aspect of the present invention, the binary sequence encoding at least one information element in the encoded document comprises a schema status mode field having a first state indicating that the information element is not changed in the first schema with respect to a corresponding element in the second schema, a second state indicating that none of sub-elements of the information element are changed in the first schema with respect to the corresponding element in the second schema, a third state indicating that the information element is changed in the first schema with respect to the corresponding element in the second schema, and a fourth state indicating that the information element is changed in the first schema with respect to the corresponding element in the second schema and that none of sub-elements of the information element are changed in the first schema with respect to the corresponding element in the second schema, the encoded information element comprising any schema reference and any other change information when the schema status mode field is in the first state, and none of sub-elements of the information element comprising a schema reference and any other change information when the schema status mode field is in the second state or fourth state.

According to another aspect of the present invention, the schema reference list comprising references to all schemas used for encoding the structured document is read in a header associated to the binary stream encoding the structured document.

BRIEF DESCRIPTION OF THE DRAWINGS

The various features of the present invention and its preferred embodiments may be better understood by referring to the following description and the accompanying drawings, wherein:

FIG. 1 depicts the binary format of a tree structure of a structured document according to MPEG-7 standard;

FIG. 2 depicts a block diagram of a MPEG-7 decoder;

FIG. 2a depicts a block diagram of a detailed part of the decoder represented in FIG. 2;

DESCRIPTION OF PREFERRED EMBODIMENTS

Figure 3:
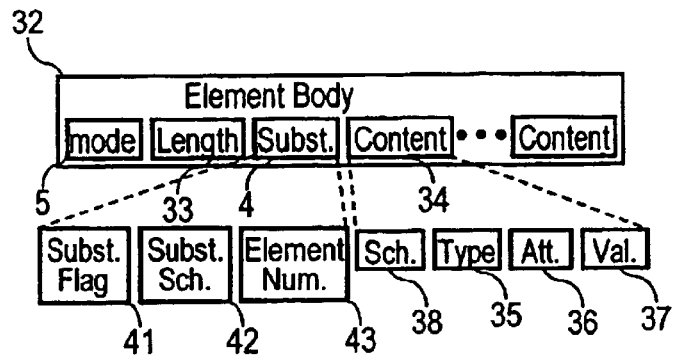
FIG. 3 depicts the binary format of an encoded information element according to the present invention.

Referring to FIG. 1, the binary format of an encoded structured document 1 according to MPEG-7 standard comprises a document header 2 which specifies encoding modes, and at least one structured information element or set of elements 3.

The document header 2 encodes the following parameters:

"allows_skipping": this parameter specifies whether element lengths are coded in the encoded document; this parameter may have the following values:

00—no length is coded,

01—length is optionally coded,

10—coding of length is mandatory.

"allows_partial_instantiation": this parameter specifies whether or not all the sub-tree or structured information elements in the document are completely instantiated or not; this parameter may have the following values:

0—no partial instantiation is allowed: all the elements of the document are present in the encoded document, 1—partial instantiation is allowed.

"allows_subtyping": this parameter specifies whether or not the sub-tree may contain polymorphisms, i.e. information elements or element attributes which may have different possible sub-types of a data type; this parameter may have the following values:

0—no polymorphism is encoded in the sub-tree,

1—polymorphism is allowed.

In FIG. 1, a set of structured information element 3 comprises an element set header 31 and elements 32 and/or sets of elements 3. The element set header 31 comprises:

a key which aims at clarifying any potential ambiguity about the type of the element during the decoding phase, and a number Nb of occurrences of similar elements or element set of in the element 3 of the next higher hierarchical level.

If the schema defining the structure of the document specifies a single mandatory value for the type of an element or element set the number of occurrences is not present in the encoded document.

An element 32 comprises the following fields:

a length parameter 33 which specifies the length in bits of the encoded value of the element, a type 35 containing a data type number specifying the structure of the element value and attributes of the element, attribute values 36 of the element, these values being ordered for example in alphabetical order, and a value 37 which encodes the value of the element itself; this field may contain one or more elements having a structure of the element 32 or element sets 3 or a simple value when the element has a simple type such as Integer, String, . . .

The length parameter 33 may be not present, depending on the value of the "allows_skipping" parameter in the header 2 of the encoded document. When the length is encoded in the element 32, a fast access to a particular element in the document is possible by skipping previous elements in the document using length information.

The fields 35, 36, 37 may be not present in the encoded element. If the possible data type of the element is unique in the schema of the document, the type number 35 is not encoded. The attribute values 36 are not encoded if the type specified in the schema does not have attributes. The value 37 of the element is not encoded if the element is empty for example in case of partial instantiation of the document.

Referring now to FIG. 2, a MPEG-7 decoder 10 comprises a schema compilator 11 designed to receive and process schemas 9 such as XML schemas, in order to obtain a binary syntax code 13 that is executed to decode encoded documents 7 that are applied in input of the decoder 10, the latter providing in output decoded documents 8 in format XML for example.

The compilation process of schemas relies on a prior schema analysis phase and aims at generating finite state automata 12 defined in the form of a binary syntax code. Each complex type defined in the processed schema is transformed into a finite state automaton expressing the complex type coding rules. The input encoded document 7 is applied to the decoder in the form of a binary stream on which the binary syntax code is executed.

In FIG. 2a, the schema compilation process 11 comprises a four phases. The first phase of schema realization consisting in flattening the type inheritances and in solving the Namespace support. This phase generates a realized schema 15. The second phase consists in generating a syntax tree from each complex type. The syntax trees 16 thus generated are then transformed in order to ease binary encoding and improve compression ratio. The third phase consists in normalizing the syntax trees generated by the previous phase in order to produce a signature for each tree node and then normalized syntax trees 17. These signatures are used in the following phase to generate a correspondence between the header keys appearing in the element headers 31 and a tree node. The fourth phase consists in generating the finite state automata 12 that are used in the decoding process.

In the schema realization phase, the schema is analyzed to list all the names used in the schema in order to attribute an expanded name to each element, attribute, type and group of elements, these names constituting the so called Namespace. The expanded names are constructed as a concatenation of a namespace identifier and an item name. Realized complex types are then generated by replacing the element references in each complex type by the definition of the elements referenced.

In the syntax tree generation phase, item nodes are generated by associating an element name to the type of the element. The item nodes linked by inclusion relations through group nodes constitute the syntax trees which are generated for each complex type. In specific cases, syntax trees are reduced to improve the compactness of the resulting binary format this process consisting in simplifying the complex type definitions in a non-destructive way.

Syntax tree normalization aims at giving unique name to every group node in the syntax tree. This process consists in ordering the nodes and finally gives a key to them, this key being needed during the automata construction phase.

A signature is generated for every element or group of elements. Every node signature is generated by the concatenation of its child node signatures. In case of an alternative group or a non-ordered group of nodes, the node signatures are alphabetically sorted and then appended. In case of a group of ordered nodes, the node signatures are appended in their order of definition in the schema. The item node signatures are equal to their element name.

In the finite state automata generation phase, a complex type automaton is recursively defined by the following rules:

1. Every node of the syntax tree produces an automaton,
2. A complex type automaton is the automaton produced by its root node,
3. Every node automaton is generated by merging of its child automata, the nature of this merging being dependent of the nature of the node.

At the end of the process, automata are realized in order to produce their transitions coding key. These automata comprise two type states and an element transition linking the latter for each item node in the syntax trees. An element transition is crossed when the corresponding element appears in the input stream of the document to be decoded. A Type state triggers when activated a specific decoder which may be a specific data type decoder in the case of a simple type and a generic or a specific one in the case of a complex type.

In some cases, the schema defining the structure of a document requires to be extended or modified. If the new schema of the encoded document applied to the decoder is available, the latter can provide a full backward and forward compatibility, both for textual and binary format. Indeed, the entire description can be validated, namespaces can be attached to each element and attribute. Moreover, hierarchy of types is available and extensibility points can be made explicit for the application. Such a schema update solves many of the technical problems raised by extensibility and compatibility. However, the standard MPEG-7 does not presently provide any information about the schema to be used to decode an encoded document. Thus a decoder configured to use a schema cannot decode a document encoded with a modified schema (no forward compatibility).

This problem can be solved merely by providing to the decoder an information about the schema to be used, prior to the decoding of the encoded document. Alternately, such automata or the syntax trees may be transformed into a binary syntax code which is executed by the decoder to decode a document in the form of an input binary stream.

In specific cases, the complexity induced by schema update might be problematic. Such a case occurs when it is not possible to easily update the decoders in order to give them access to a modified schema (forward compatibility), for example when the number of decoders to be updated is very high or when the decoders are not designed to use other schemas. In order to deal with these specific situations, the object of the present invention is to propose an information element binary format and an encoding and decoding method that allows a decoder to at least "partially" decode a document having a modified or extended structure with respect to a schema known by the decoder.

In this respect, at encoding phase a level of compatibility is chosen. This level is expressed in terms of a set of schemas for which compatibility should be ensured. The encoding process adds necessary redundancy to ensure the expected compatibility. In extreme case, if compatibility with only one current schema is needed, redundancy is removed, and the resulting binary encoded document is conformant to the current schema.

Basically the encoding process adds in the encoded document information about the schema used at encoding phase. This information comprises schema identifiers and length information to allow skipping of an element in the document encoded using a schema not available to the decoder.

The schema identifiers are defined by a schema identifier dictionary which is known from the decoder, for example inserted in the header 2 of the encoded document or inserted in a decoder initialization and configuration file used by the decoder. This schema identifier dictionary contains all possible schema identifiers that are to be used by the decoder to decode the encoded documents received. This dictionary can be read by the decoder using the following binary syntax:

TABLE 1

| SchemaDictionary( ){ | Number of bits |
|---|---|
|    NumberOfSchemaIdentifiers | UINTVLC |
|    i = 0 | |
|    while (i < NumberOfSchemaIdentifiers) { | |
|       SchemaIdentifier [i] | String |
|       i++ | |
|    } | |
| } | | where "NumberOfSchemaIdentifiers" and "SchemaIdentifier[ ]" represents respectively the number of schema identifiers in the dictionary and an array containing the schema identifiers, and "UINT_VLC" specifies a format to encode unsigned integers of indefinite size. In the format "UINT_VLC", an integer is encoded by an infinite set of integer chunks, each chunk being composed of 5 bits. The first bit of each chunk specifies if an other chunk follows the current one, and the last 4 bits of the chunk encode the integer.

This binary syntax indicates that a schema dictionary comprises the number, followed by a list of schema identifiers in the form of character strings, the position of each schema identifier in the list automatically defining a schema number that may be used in the encoded document to identify a specific schema. The reading process of the dictionary comprises successively a step of reading in the dictionary the number of schemas "NumberOfSchemaIdentifiers", a step of initializing a counter i, and loop instructions comprising a step of reading the $i^{th}$ value in the "SchemaIdentifier[ ]" array, and a step of incrementing the counter i, with $0 \leq i <$ NumberOfSchemaIdentifiers. In the following table, the dictionary contains three schema identifiers, each schema being implicitly associated with a binary schema number defined by the rank of the schema identifier in the dictionary.

TABLE 2

| Schema Identifier | Implicit Number |
|---|---|
| $S_1$ | 00 |
| $S_2$ | 01 |
| $S_3$ | 10 |

The length (number of bits) of a binary schema number is defined as a function of the number of schema identifiers in the dictionary and equal to $E(\log_2$ (NumberOfSchemaIdentifiers)), $E(x)$ being equal to x rounded to the next higher integer.

As shown in FIG. 3, each type number field 35 in the encoded document is associated with a schema number field 38, the schema number corresponding to a schema identifier defined in the schema dictionary, this schema number identifying a schema in which the associated type is defined.

In this manner, an encoder and a decoder according to the present invention can use several schemas to encode and decode a document.

Three types of change are considered in XML language between an schema S0 and a modified schema S1, these change types being possibly combined together. A first type of change is the substitution of a global element name by another global element name, a global element being defined in a schema in an independent manner with respect to other elements (not nested in another element). Such a change is defined in XML schema language as follows.

In XML schema S0:

```
. . .
<complexType name="S0:t0" base="string">
. . .
<element name="e0" type="S0:t0"/>
. . .
``` and in XML schema S1:

```
. . .
<element name="e1" type="S0:t0" substitutionGroup="S0:e0"/>
. . .
```

This syntax defines a complex type "t0", two elements named "e0" and "e1" having the type "t0", the element "e1" being substituted to the element "e0". Such an element "e1" having a value "value1" may appear in a XML document based on schema S1 as follows:

```
. . .
<e1>value1</e1>
. . .
```

According to the invention, such a modification is encoded by adding in an element 32 substitution fields 4 comprising:

a substitution flag 41 a substituted element number 43, and a schema number 42 where the element number 43 is defined.

When the substitution flag is set to 0, the following substitution fields 42 and 43 are not present in the encoded element.

The element "e1" encoded with schema S1 containing the definition of "e1" comprises as depicted in FIG. 3 the following field values:

[length]1[S1][e1][S0][t0][value1]

where:

[length] is the binary encoded length of the element, "1" is the value of the substitution flag indicating a substitution, [S1] and [S0] are the encoded numbers of schemas S1 and S0 as defined by the schema dictionary, [t0] is the encoded type number of type "t0", [value1] is the encoded value of the value "value1" of element "e1" and [e1] is the encoded number of element "e1".

Such a binary code will be decoded according to the present invention by a decoder which only knows schema S0 (and therefore "e0") and the decoded element can be interpreted as follows:

<e0 DDL:IsSubstituted="true">value1</e0>

Thus the decoder does not understand the meaning of [e1] and considers that "value1" is the value of element "e0" which is substituted by another unknown element.

A second type of change between a schema S0 and a new one S1 consists in deriving by restriction a new type t1 from a type "t0". Such a restriction consists in reducing the number of maximal occurrences of at least one element or group of elements in the type definition, or increasing its number of minimal occurrences, or changing the type t0 to a sub-type t1, or defining a new group of elements that respect the constraints defined previously in the type t0.

Such changes are expressed in XML schema language in the following example. The XML schema S0 comprises the following text syntax:

In this example, type "t0" is defined in XML schema language as comprising any number of occurrences of an element "e1". Type "t1" is defined as a restriction of type "t0" and comprises 0 or one single element "e1" which is a particular case of type "t0". Thus, type "t1" enforces type "t0" constraints and the same binary format can be used.

The document to be encoded contains the following information:

<S0:e xsi:type="S1:t1">
  <e1>value1</e1>
</S0:e>

This means the document contains an element "e" having the type "t1" which is a sub-type of the expected type "t0" of element "e" defined in schema S0.

If forward compatibility is not required, this element can be encoded as follows:

[length]0[S1][t1][value1]

where "0" is the value of the substitution flag set to no substitution.

A decoder knowing schema S0 and not S1 decodes the fields [length] and [S1]. Since S1 is not defined in the schema dictionary, it deduces that the other fields relative to the element "e" cannot be interpreted using schema S0 and skips element "e" using the length information. If the decoder knows schema S1 (and therefore S0), it will retrieve the original structure of element "e".

If forward compatibility is required, the element "e" is encoded according to the structure defined in FIG. 3 as follows:

[length]0[S0][t0][value1][S1][t1]

A decoder knowing both schemas S0 and S1 can decode all the fields of encoded element "e". Then by comparing the length field and the length of the decoded stream, it deduces that there is no more sub-typing and will retrieve the original structure of element "e". If the decoder knows schema S0 and not S1, it will decode the first part of the fields and skip [S1] and [t1] fields (using the length field). Thus it creates the following textual tree:

```
. . .
<complexType name="t0">
    <sequence>
        <element name="e1" type="string" maxOccurs="unbounded"/>
    </sequence>
</complexType>
. . .
<element name="e" type="S0:t0"/>
. . .
In XML schema S1:
. . .
    <complexType name="t1">
        <complexContent>
            <restriction base="S0:t0">
                <sequence>
                    <element name="e1" type="string" maxOccurs="1"/>
                </sequence>
            </restriction>
        </complexContent>
    </complexType>
    . . .
```

```
<S0:e xsi:type="S0:t0" DDL:isSubtype="true">
    <e1>value1</e1>
</S0:e>
```

A third type of change between an old schema S0 and a new one S1 consists in deriving by extension a new type t1 from a type "t0". If forward compatibility should be ensured, the new type t1 should be defined in two parts, the first part having the type "t0" and the second part having a the type "t1" which has to be defined in the new schema S1.

Such changes are expressed in XML schema language in the following example. The XML schema S0 comprises the following text:

```
...
<complexType name="t0">
    <sequence>
        <element name="e1" type="string"/>
    </sequence>
</complexType>
...
<element name="e" type="S0:t0"/>
...
```

In XML schema S1, the new type t1 is defined as an extension of the type t0 as follows:

```
...
<complexType name="t1">
    <complexContent>
        <extension base="S0:t0">
            <sequence>
                <element name="e2" type="string"/>
            </sequence>
        </extension>
    </complexContent>
</complexType>
...
```

If forward compatibility is required, the XML document to be encoded contains the following information:

```
<S0:e xsi:type="S1:t1">
    <e1>value1</e1>
    <e2>value2</e2>
</S0:e>
``` where value1 is the part of type "t0" in type "t1" and "value2" is the part specific to type "t1" and added to type "t0". This information is encoded as follows:

[length]0[S0][t0][value1 ][S1][t1][value2]

If the decoder knows S0 (and not S1), it will decode the first part of the binary encoded information and skip t1 part (i.e. [t1][value2]) using the length information. Such a process leads to the following textual tree:

```
<S0:e xsi:type="S0:t0" ddl:isSubtype="true">
    <e1>value1</e1>
</S0:e>
```

Figure 4:
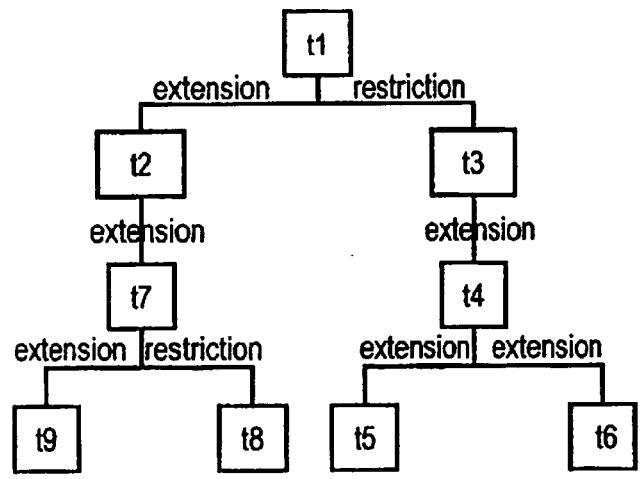
FIG. 4 depicts element types defined with respect to each other in a tree structure.

Thus the specific part of t1 will not be decoded. If the decoder knows both schemas S0 and S1, it will retrieve the original textual tree:

The above dispositions may be combined thus allowing the definition of complex hierarchies of types which may be defined in different schemas. FIG. 4 represents an example of such a hierarchy where types t5 and t6 are two extensions of a type t4 which is an extension of a type t3, type t3 being a restriction of a type t1. In a similar manner types t8 and t9 are respectively a restriction and an extension of a type t7 which is an extension of a type t2, type t2 being an extension of type t1. Considering that each of the types t1 through t9 are defined in respective different schemas S1 through S9, if compatibility is required with schemas S1, S3, S4 and S5, an element of type t5 is encoded in the following form:

[length]0[S1][t1][att1][value1][S3][t3][S4][t4][att4][value4][S5][t5][att5][value5]

where the fields [att-i] are the respective encoded attribute values of types t-i and [att-i][value-i] are the t-i part of type t5 (-i=1, 4 and 5). If compatibility is required with schemas S3 and S5, an element of type t5 is encoded in the following form:

[length]0[S3][t3][att3][value3][S5][t5][att5][value5]

where the fields [att3][value3] are the t1 part of type t5, coded according to type t3, and [att5][value5] are the t4+t5 part of type t5 coded according to t5.

Of course, the above mentioned first type of change between schemas may be combined with the second and third types of change by adding substitution fields 4 to the encoded elements.

In the foregoing description, forward compatibility is obtained by adding to the encoded document binary substitution fields (fields 41, 42, 43) and a schema number field in association to each element type. Therefore this solution increases the size of a resulting encoded document. In order to optimize encoding, it appears that parts of an encoded document are often linked to the same schema. In this respect, the present invention proposes to add in each encoded element 32 as illustrated on FIG. 3 a field 5 containing a schema status code representing a schema status mode. This field defines whether the corresponding element and sub-elements require specifications coming from a same schema or not. If the same schema is used for encoding (and decoding) an element and all sub-elements of the latter, the fields 38, 42 added for ensuring forward compatibility (containing schema numbers) are removed from the encoded element, thus increasing the resulting compression ratio.

The following table defines the possible values of the schema status code.

TABLE 3

| Schema Status Mode | Value |
| --- | --- |
| no change | 0 |
| freeze the schema | 10 |
| Change the schema | 11 | where:

"no change" means that the schema used for the decoding process of the element is the same than the one used for the element itself. Thus the element 32 does not contain a schema number field 38 and a substitution schema field 42.

"freeze the schema" means that the schema used for the decoding process of the element and all the sub-elements of the element (all the sub-tree of the element) is the same than the one used for the element itself. Thus the element 32 and all sub-elements of the element does not contain any schema number field 38, 42, and schema status field 5.

"change the schema" means that the schema of the element is changed. Thus the schema number fields 38, 42 are present in the element 32.

Figure 5:
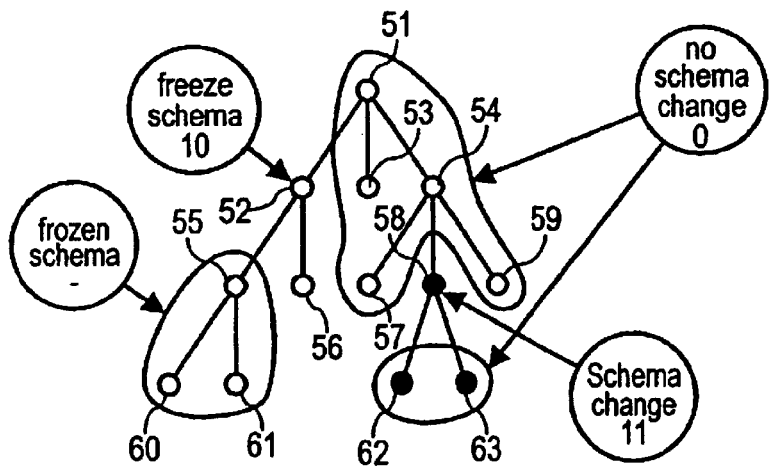
FIG. 5 depicts a structured document comprising information elements organized in a tree structure.

The mechanism controlled by the schema status code is illustrated by FIG. 5. This figure depicts the tree structure of a structured document comprising a main element 51 containing three sub-elements 52, 53, 54. The element 52 comprises two sub-elements 55, 56, and the element 54 three sub-elements 57, 58, 59. The element 55 comprises two sub-elements 60, 61.

The elements 51, 53, 54, 57 and 59 are encoded with a schema status code 5 set to 0 ("no change"). These elements do not contain any schema number fields 38, 42. The schema status code 5 of element 52 is set to 10 ("freeze the schema"). Thus all sub-elements 55, 56 and 60, 61 of element 52 are encoded with the same schema defined in the element 52, and these sub-elements do not contain any schema number fields 38, 42, and schema status code field 5.

The element 58 is modified and defined in another schema as comprising two sub-elements 62, 63. Thus the schema status code 5 of element 58 is set to 11 ("change the schema"). If the elements 62 and 63 are defined in the same schema as element 58, the schema status codes 5 of elements 62 and 63 are set to 0.

A further optimization may be performed by adding one possible value to the schema status code 5, as follows:

TABLE 4

| Schema Status Mode | Value |
| --- | --- |
| no change | 0 |
| freeze the schema | 10 |
| change the schema | 110 |
| Change and freeze the schema | 111 |

When the schema status code of an element is set to 110 or 111, the schema of the element is changed. If this code is set to 110 the sub-elements of the latter contain a schema status mode field 5. When this code is set to 111, all the sub-elements of the element are encoded using the schema of the latter.

In the example of FIG. 5, the schema status code of element 58 may be set to 111 so as to specify that elements 62 and 63 are defined in the same schema as element 58. Thus no schema status code fields 5 are required in the elements 62 and 63.

What is claimed is:

1. An encoding method for enabling a decoder to at least partially decode a structured document having a structure defined in at least a first schema not accessible to the decoder and resulting from a change of at least a second schema accessible to the decoder, a structured document comprising information elements nested in each other, the information elements of the document being associated in at least a first schema and a second schema with respective element types each defining respective element structures of the information elements, the first schema being not accessible to a decoder and the second schema being accessible to the decoder, the first schema defining at least one derived information element which is derived from a corresponding element defined in the second schema, the encoding method comprising the steps of:

encoding the document using said first and second schemas into a binary stream comprising for each information element of the document a binary sequence encoding the information element, and inserting in the binary sequence encoding the derived information element a reference designating the first schema defining the structure of the derived element, said reference designating the first schema being defined in a schema reference list containing references to all schemas used for encoding the document, the schema reference list being made accessible to the decoder.

2. The encoding method according to claim 1, wherein the binary sequence encoding each element of the document comprises a content field containing an encoded value of the element and a length field placed before the content field and containing an encoded value of a length of the content field.

3. The encoding method according to claim 2, wherein the derived information element is associated in the first schema to a structure type which is restricted with respect to the structure type of the corresponding information element in the second schema, the binary sequence encoding the derived element comprising a content field and appended to the content field, a reference to the first schema and a reference to the structure type of the derived element, defined in the second schema.

4. The encoding method according to claim 2, wherein the derived information element is associated in the first schema to a structure type which is extended with respect to the structure type of the corresponding information element in the second schema, the structure type of the derived information element comprising a first part having the structure type of the corresponding information element defined in the second schema and a second part specific to the derived information element and having a structure type defined in the first schema, the binary sequence encoding the derived element comprising a content field comprising:

a field containing the reference to the second schema, a field containing a structure type reference to the structure type of the corresponding element in the second schema, a field containing an encoded value of the first part, a field containing the reference to the first schema, a field containing a structure type reference to the structure type of the second part, and a field containing an encoded value of said second part.

5. The encoding method according to claim 1, wherein the binary sequence encoding an information element comprises a substitution field including a substitution flag indicating whether or not the name of the information element is changed, and if the substitution flag indicates a change, an element name reference field containing a reference designating a new name of the information element, and a schema reference field containing a reference to a schema where the new name reference is defined.

6. The encoding method according to claim 1, wherein the binary sequence encoding at least one information element in the encoded document comprises a schema status mode field having:

a first state indicating that the information element is not changed in the first schema with respect to a corresponding element in the second schema, a second state indicating that none of sub-elements of the information element are changed in the first schema with respect to the corresponding element in the second schema, and a third state indicating that the information element is changed in the first schema with respect to the corresponding element in the second schema, the encoded information element comprising any schema reference and any ether change information when the schema status mode field is in the first state, and none of sub-elements of the information element comprising a schema reference and any other change information when the schema status mode field is in the second state.

7. The encoding method according to claim 1, wherein the binary sequence encoding at least one information element in the encoded document comprises a schema status mode field having a first state indicating that the information element is not changed in the first schema with respect to a corresponding element in the second schema, a second state indicating that none of sub-elements of the information element are changed in the first schema with respect to the corresponding element in the second schema, a third state indicating that the information element is changed in the first schema with respect to the corresponding element an the second schema, and a fourth state indicating that the information element is changed in the first schema with respect to the corresponding element in the second schema and that none of sub-elements of the information element are changed in the first schema with respect to the corresponding element in the second schema, the encoded information element comprising any schema reference and any other change information when the schema status mode field is in the first state, and none of sub-elements of the information element comprising a schema reference and any other change information when the schema status mode field is in the second state or fourth state.

8. The encoding method according to claim 1, wherein the schema reference list comprising references to all schemas used for encoding the structured document is inserted in a header associated to the binary stream encoding the structured document.

9. A decoding method for at least partially decode a binary stream encoding a structured document having a structure defined in at least a first schema not accessible to the decoder and resulting from a change of at least a second schema accessible to the decoder, a structured document comprising information elements nested in each other, the information elements of the document being associated in at least a first and a second schemas with respective element types each defining the respective element structures of the information elements, the first schema being not accessible to a decoder and the second schema being accessible to the decoder, the first schema defining at least one derived information element which is derived from a corresponding element defined in the second schema, the decoding method comprising the steps of:

sequentially reading a binary stream encoding the structured document using the second schema so as to detect in the binary stream binary sequences encoding each information element of the document, detecting in a each detected binary sequence of an encoded information element a reference to the first schema, as defined in a schema reference list known by the decoder, if such a reference to the first schema is not detected in the detected binary sequence, decoding said detected binary sequence according to the structure defined in the second schema of the information element encoded into said detected binary sequence, and if such a reference to the first schema is detected in the detected binary sequence, identifying from the detected reference to the first schema binary data encoding an information element of the structured document having a structure defined in said first schema, and skipping said identified binary data during the sequential reading of said binary stream.

10. The decoding method according to claim 9, wherein the binary sequence encoding each element of the document comprises a content field containing an encoded value of the element and a length field placed before the content field and containing the length encoded value, the length encoded value being used by the decoder for determining the end of the binary sequence encoding an element.

11. The decoding method according to claim 10, further comprising the steps of:

reading and decoding a length coded value in the binary sequence containing a reference to the first schema, and determining a length of binary data to skip as a function of the decoded length value and the position in the binary sequence of the reference to the first schema.

12. The decoding method according to claim 9, wherein the derived information element is associated in the first schema to a structure type which is restricted with respect to the structure type of the corresponding information element in the second schema, the binary sequence encoding the derived element comprising a content field and appended to the content field, a reference to the first schema and a reference to the structure type of the derived element, defined in the second schema.

13. The decoding method according to claim 9, wherein the derived information element is associated in the first schema to a structure type which is extended with respect to the structure type of the corresponding information element in the second schema, the structure type of the derived information element comprising a first part having the structure type of the corresponding information element defined in the second schema and a second part specific to the derived information element and having a structure type defined in the first schema, the binary sequence encoding the derived element comprising a content field comprising:

a field containing the reference to the second schema, a field containing a structure type reference to the structure type of the corresponding element in the second schema, a field containing an encoded value of the first part, a field containing the reference to the first schema, a field containing a structure type reference to the structure type of the second part, and a field containing an encoded value of said second part.

14. The decoding method according to claim 9, wherein the derived information element has in the first schema a name which is changed with respect to the name of the corresponding information element in the second schema, the binary sequence encoding the derived element including a substitution field comprising a substitution flag indicated whether or not the name of the derived information element is changed, and if the substitution flag indicates a change, a schema reference field containing a reference to the first schema and an element name reference designating the name of the derived information element in the first schema.

15. The decoding method according to claim 9, wherein the binary sequence encoding at least one information element in the encoded document comprises a schema status mode field having:
- a first state indicating that the information element is not changed in the first schema with respect to a corresponding element in the second schema,
- a second state indicating that none of sub-elements of the information element are changed in the first schema with respect to the corresponding element in the second schema, and
- a third state indicating that the information element is changed in the first schema with respect to the corresponding element in the second schema,
- the encoded information element comprising no schema reference and no other change information when the schema status mode field is in the first state, and none of sub-elements of the information element comprising a schema reference and any other change information when the schema status mode field is in the second state.

16. The decoding method according to claim 9, wherein the binary sequence encoding at least one information element in the encoded document comprises a schema status mode field having a first state indicating that the information element is not changed in the first schema with respect to a corresponding element in the second schema, a second state indicating that none of sub-elements of the information element are changed in the first schema with respect to the corresponding element in the second schema, a third state indicating that the information element is changed in the first schema with respect to the corresponding element in the second schema, and a fourth state indicating that the information element is changed in the first schema with respect to the corresponding element in the second schema and that none of sub-elements of the information element are changed in the first schema with respect to the corresponding element in the second schema, the encoded information element comprising any schema reference and any other change information when the schema status mode field is in the first state, and none of sub-elements of the information element comprising a schema reference and any other change information when the schema status mode field is in the second state or fourth state.

17. The decoding method according to claim 9, wherein the schema reference list comprising references to all schemes used for encoding the structured document is read in a header associated to the binary stream encoding the structured document.

* * * * *

UNITED STATES PATENT AND TRADEMARK OFFICE
CERTIFICATE OF CORRECTION

PATENT NO. : 6,825,781 B2  
APPLICATION NO. : 10/470218  
DATED : November 30, 2004  
INVENTOR(S) : Claude Seyrat et al.

Page 1 of 1

It is certified that error appears in the above-identified patent and that said Letters Patent is hereby corrected as shown below:

<u>Column 17,</u>  
Line 16, delete "ether" and insert -- other --.  
Line 27, delete "an" and insert -- in --.

<u>Column 20,</u>  
Line 3, delete "schemes" and insert -- schema --.

Signed and Sealed this

Twenty-seventh Day of June, 2006

JON W. DUDAS  
*Director of the United States Patent and Trademark Office*